3,440,062

METALIZING COMPOSITIONS CONTAINING CRITICAL PROPORTIONS OF METAL (Pt-Au OR Pd-Au) AND A SPECIFIC HIGH DENSITY FRIT

Lewis C. Hoffman, Wilmington, Del., assignor to E. I. du Pont de Nemours and Company, Wilmington, Del., a corporation of Delaware No Drawing. Filed Feb. 28, 1966, Ser. No. 530,410
Int. Cl. C09d 5/10
U.S. Cl. 106—1 12 Claims

ABSTRACT OF THE DISCLOSURE

Metalizing compositions comprising from 70 to 95% finely divided noble metal powder and 30 to 5% finely divided inorganic binder, wherein the noble metal powder contains critical amounts of gold, platinum, and/or palladium, and said inorganic binder consists essentially of glass having a density of at least 7.2 gm./cc. These particular compositions can be fired over a wide range of firing conditions to produce coatings which do not migrate, possess superior temperature stability and exhibit high adhesive values.

This invention relates to metalizing compositions containing noble metal powders and inorganic binders which are usable in the production of printed electrical components. The metalizing compositions of this invention have particular utility in that fired-on coatings formed therefrom can have conductive wiring secured thereto by dip soldering.

The dip solderable metalizing compositions of the prior art contain a noble metal constituent, either finely divided silver particles, palladium particles, or mixtures thereof, and a vitreous binder. These metalizing compositions have enabled electrical subcircuits fired on ceramic substrates to be incorporated into circuits containing power sources, speaker systems, cathode ray tubes and the like with a minimum of labor. While these prior art compositions are susceptible of application to ceramic substrates, and of having wire leads soldered thereto, they are not without limitations. For example, fired-on coatings formed from metalizing compositions containing silver particles have a low tolerance to solder baths and can be immersed therein only for a few seconds. Faulty solder connections cannot be remedied by repeated redipping with the result that the incident of defective connections and/or connections with marginal acceptance values are higher than is desirable. Ceramic substrates with silver fired-on coatings having defective components soldered to the fired-on coatings cannot be repaired by replacing the defective component due to the inability of the fired-on silver coating to be resoldered. Moreover, the fired-on coatings formed from metalizing compositions containing silver, exhibit a tendency to "migrate," i.e., to form short circuits between adjacent conductive paths and solder pads of different electrical potentials in the presence of moisture. Metalizing compositions whose metal content is entirely palladium particles must be fired under conditions controlled as to time, temperature and atmosphere, or soldering will not be achievable. The fired-on coatings resulting from the use of such compositions generally are not refirable. Metalizing compositions containing both silver and palladium particles have somewhat-improved tolerances to firing conditions and soldering bath immersion than do the metalizing compositions containing as the metal component only palladium particles or silver particles respectively, but still require that considerable skill be employed in their use.

The metalizing compositions most closely related to the present invention are those described in the Knox U.S. Patent 2,385,580; the Christenson U.S. Patent 2,461,878; the Soby U.S. Patent 2,551,712; the Raymond et al. U.S. Patents 2,557,983, 2,569,773 and 2,592,601; the Short U.S. Patent 2,819,170 and the Larson et al. U.S. Patent 2,822,279.

The dip solderable metaliznig compositions of this invention can be used over a less restrictive range of firing conditions and the fired-on coatings can be immersed in solder baths over a longer time range than can the metalizing compositions of the prior art. Moreover, fired-on coatings resulting from the use of the metalizing composition of this invention show no tendency to "migrate" and have a superior elevated temperature stability than do the prior fired-on silver coatings. The elevated temperature stability is a measure of the ability of a fired-on coating to maintain an adhesive value in excess of 550 p.s.i. after having been subjected to a given temperature for a number of hours. The fired-on coatings resulting from the use of the dip solderable metalizing compositions of this invention can be refired through many cycles, while still retaining their solderability, conductivity and adhesive properties. This ability to be refired enables the conductive paths and solder pads formed from the metalizing compositions of this invention to be initially applied and fired at high temperatures to achieve high adhesion to the substrate followed by the application and firing of resistive paths which must be fired at lower temperatures, and the multi-application and multi-firing of the conductive and dielectric layers of capacitors.

The metalizing compositions of this invention comprise from 70 to 95% by weight finely divided noble metal powder, and from 5 to 30% by weight, finely divided inorganic binder. The noble metal powder comprises either a mixture of 85 to 90% by weight gold and 15 to 10% by weight platinum or 83 to 88% by weight gold, and 17 to 12% by weight palladium.

The finely divided inorganic binder comprises a glass having a density of 7.2 gm./cc. composed essentially of from 55 to 85% by weight $Bi_2O_3$, from 5 to 42% by weight PbO, from 0.5 to 5.0% by weight $B_2O_3$, and from 0.5 to 5.0% by weight $SiO_2$. While the compositions may comprise 95 to 70% by weight metal powder and 5 to 30% by weight inorganic binder, it is preferred in most instances to employ a ratio of metal powder to binder which lies within the range of from 88 to 78% by weight metal powder and 12 to 22% by weight binder. Metal concentrations of 95 to 88% should be used where high current loads are contemplated. Binder concentrations of from 22 to 30% by weight should be used in those instance where extremely high adhesion of the fired-on coatings to the substrate on which they are used is necessary or desirable. Generally, however, metal and binder concentrations within the preferred range will be found acceptable for most uses.

The noble metal component of the metalizing compositions of this invention, as previously mentioned, can be a mixture of 90 to 85% by weight gold particles and 10 to 15% by weight platinum particles or a mixture of 88 to 83% by weight gold particles and 12 to 17% by weight palladium particles. Mixtures of gold and platinum as above defined, and mixtures of gold and palladium as above defined can themselves be mixed in any desired ratio to provide dip soldering metalizing compositions of this invention. Preferably, the gold and platiinum particles are present in the ratio of 87 parts of gold to every 13 parts of platinum. Metalizing compositions containing gold and palladium preferably contain 85 parts of gold to every 52 parts of palladium. Metatlizing compositions of this invention containing these preferred ratios of noble metals have produced fired-on coatings having excellent properties.

The noble metal components of the metalizing compositions of this invention are generally used with stencilling screens, and when so used are sufficiently finely divided to pass through the ncreen with which they are used. Stencilling screens of 100, 160, 200 and 325 mesh (U.S. Standard Sieve Scale) can be used. Generally, the metal powder will have an average particle size not exceeding 40 microns with no more than 5% of the particles being larger than 42 microns. Desirably, the average particle size will not exceed about 5 microns and preferably will be in the range of 0.1 to 1.0 micron. The most preferred powder will be essentially free of particles of a size greater than 5 microns with an average particle size in the range of 0.1 to 1.0 micron.

In the examples set forth hereinafter, the metal components of the metalizing compositions were prepared as follows:

The platinum particles were prepared by mixing together at room temperature 100 ml. of a 25% by weight aqueous solution of $PtCl_4$ and 100 ml. of a 10% by weight aqueous solution of reducing agent consisting of 50% by weight $FeSO_4$ and 50% by weight glycerol, $CH_2OHCHOHCH_2OH$. The platinum particles which precipitated from this mixture had an average particle size of 0.1 micron. The palladium particles were prepared by mixing at room temperature 100 ml. of an ammoniacal solution of pH 12 containing 20% by weight $PdCl_2$ with 10 ml. of an aqueous solution containing 10% by weight dihydrazine sulfate, $H_2NNH_2 \cdot 2H_2SO_4$. The resulting palladium particles had an average particle size of 0.2 micron. The gold particles were prepared by mixing at room temperature 100 ml. of an aqueous solution of 25% by weight of $AuCl_3$ with 100 ml. of a 10% by weight solution of $FeSO_4$. The resulting gold particles had an average particle size of 1 micron. In each instance the noble metal particles were recovered from the mixed solutions, were dried and were mixed in the desired ratio.

The inorganic binder component of the new and improved metalizing compositions of the present invention as previously mentioned comprises a glass having a density in excess of about 7.2 gm./cc. and consisting essentially of between 55 to 85% $Bi_2O_3$, 5 to 42% PbO, 0.5 to 5% $B_2O_3$ and 0.5 to 5% $SiO_2$ wherein all percentages are by weight. Glasses within the range of 70–85% $Bi_2O_3$, 5–25% PbO and 6–10% combined amount of $SiO_2$ and $B_2O_3$, and having densities in excess of 7.2 gm./cc., exhibit outstanding adhesive characteristics. The preferred glasses of this invention have composition values by weight of approximately 82% $Bi_2O_3$, 11% PbO, 3.5% $B_2O_3$ and 3.5% $SiO_2$.

Other metal oxides such as CaO, BaO, $Ln_2O$, $K_2O$, $TiO_2$, CuO, ZnO, $Zr.O_2$, $Sb_2O_4$, $Ti_2O$ and $Cd_2O_3$ can be incorporated into the glass in minor amounts from about 0 to 10% by weight based on the amount of glass present. The glasses which form part of the metalizing compositions of this invention are prepared by mixing together all of the constituents thereof, melting the same at 900 to 1100° C. until equilibrium is reached and pouring the melts onto steel plates and allowing them to solidify. The glass compositions are then ball-milled in normal fashion and dried to yield fine particles having a particle size or less than 30 microns, and preferably in the range of from 10 to 20 microns. The preferred glass composition of 82% $Bi_2O_3$, 11% PbO, 3.5% $B_2O_5$ and 3.5% $SiO_2$, prepared in the above manner and having an average particle size within the range of 10 to 20 microns with no particles larger than 42 microns, was employed as the sole component of the inorganic binder in the examples below.

While the preferred inorganic binder consists entirely of the glass described above, metal oxides such as $Bi_2O_3$, PbO and CdO may be used as separate additives in minor amounts of 0–10% by weight based on the amount of glass present.

The metalizing compositions described above can be sprinkled onto a ceramic substrate through a suitable perforate masking layer in any circuit design desired, and can then be fired to provide a fired-on coating thereon. It is preferred, however, to mix inert organic vehicles with the metalizing compositions described above to form metalizing compositions referred to in the art, as inks. These inks generally contain 2 to 20 parts of metal and inorganic binder for every 1 part of vehicle. For screen stencilling purposes, ratios of 3 to 6 parts of metal and inorganic binder for every 1 part of vehicle have been found to have good application properties. Of these inks, inks having about 4 parts of metal and inorganic binder for every 1 part of vehicle are preferred.

The term "inert organic vehicle" includes any organic liquid which is inert to the other components of the metalizing composition and in which the inorganic binder and metal powder can be dispersed and applied to a substrate. Examples of such vehicles are methyl, ethyl, butyl, propyl and higher alcohols; the corresponding esters such as the acetates, propionates, etc.; the terpenes such as pine oil, alpha-terpineol and beta-terpineol; and solutions of resins such as the polyterpene resins, the polymethacrylates of the lower alcohols, and ethylcellulose in solvents such as aliphatic petroleum naphtha, terpene and alkyl ethers of ethylene glycol. The vehicle may contain volatile liquids such as kerosene, xylene, toluene and the like to promote fast setting after application. The inert organic vehicle which is preferred consists of an 8% solution of ethyl-cellulose in beta-terpineol.

The metalizing compositions of this invention are usable with all of the ceramic substrates known to the metalizing art including, but not limited to those composed of forsterite, sapphire, steatite, titanium dioxide, alkali earth titanates, zircon, porcelain and alumina.

The high adhesion, solderability and other excellent properties characterizing the metalizing compositions of this invention can best be demonstrated by testing the fired-on coating formed therefrom.

The metalizing compositions prepared for testing contained the following relative amounts of materials:

| Metalizing composition components | Example 1 | Example 2 |
|---|---|---|
| Gold powder (1 micron average particle size), percent | 69.97 | 65.97 |
| Platinum powder (0.1 micron average particle size), percent | 10.51 | ---------- |
| Palladium powder (0.2 micron average particle size), percent | | 11.96 |
| Inorganic binder powder, percent | 19.52 | 22.07 |
| | 100.00 | 100.00 |
| Ratio of noble metal powder and inorganic binder to organic vehicle (8% solution of of ethylcellulose in beta-terpineol) | 4.38:1 | 4.38:1 |

Ten millimeter diameter circles of metalizing composition were screen stencilled through a 165 mesh screen stencil onto alumina plates (AlSiMag "614"), dried and fired at 1050° C. for a total of two minutes to provide a number of test elements. Tinned copper wires of 0.025 in. diameter were then dip soldered on with 63 lead-37 tin solder at a temperature of 210–215° C.

Adhesion was tested by applying force so as to cause the wire to "peel" out of the solder. The testing was done in an "Instron" tester at a crosshead speed of ten inches per minute. A chart recorder was used to record the pounds of pull necessary to cause failure. The failure stress was calculated by an empirical method. Circular cross-section copper wiring of known area was soldered to metalizings, so as to produce a "butt" joint. The failure force recorded was easily converted to stress since the area resisting pull was known. The failure force recorded in "peel" was used to calculate an empirical cross-sectional area resisting failure to "peel" by dividing the observed force in pounds by the butt joint stress in pounds/in.$^2$. Calculations over a variety of temperature and time conditions approximated 0.0018 in.$^2$ as the area involved, if the longitudinal dimension along the portion of the peeling head parallel to the substrate is three wire diameters. Throughout this application, the failure stresses given are determined by dividing the observed Instron failure force by 0.0018 in.$^2$.

Example 1, the preferred embodiment of this invention, on testing exhibited an adhesive strength of 2,100 p.s.i. and Example 2 on testing exhibited an adhesive strength of 2,300 p.s.i. No difficulties were encountered with the test elements of either example during the firing. Solder bath immersion times of from 15 seconds to two minutes, the maximum test time employed, did not lead to non-solderability.

At temperatures of 80–90° C. the elevated temperature stability of test elements of both examples as measured in hours was unlimited. At a temperature of 150° C., the elevated temperature stability of test elements of both examples was in excess of 1000 hours.

Having described the various embodiments of this invention for purposes of illustration rather than limitation what is claimed is as follows.

I claim:

1. A metalizing composition comprising from 70 to 95% by weight finely divided noble metal powder, and from 30 to 5% by weight finely divided inorganic binder, said noble metal powder comprising from 85 to 90% by weight gold particles and from 15 to 10% by weight platinum particles, said inorganic binder consisting essentially of glass having a density of at least 7.2 gm./cc. and said glass consisting essentially of from 55 to 85% by weight $Bi_2O_3$, from 5 to 42% by weight PbO, from 0.5 to 5.0% by weight $B_2O_3$, and from 0.5 to 5.0% by weight $SiO_2$

2. The metalizing composition of claim 1 further characterized in that it is comprised of 78 to 88% by weight finely divided noble metal powder and from 22 to 12% by weight finely divided inorganic binder.

3. The metalizing composition of claim 1 further characterized in that said finely noble metal powder comprises about 87% by weight gold particles and about 13% by weight platinum particles, and said glass consists essentially of about 82% by weight $Bi_2O_3$, about 11% by weight PbO, about 3.5% by weight $B_2O_3$ and about 3.5% by weight $SiO_2$.

4. The metalizing composition of claim 1 further characterized in that said glass consists essentially of 70 to 85% by weight $Bi_2O_3$, 5 to 25% by weight PbO and 6 to 10% by weight combined amount of $SiO_2$ and $B_2O_3$.

5. An ink comprising for 2 to 20 parts of the metalizing composition of claim 1 and 1 part of an inert organic vehicle.

6. A metalizing composition comprising from 70 to 95% by weight finely divided noble metal powder and from 30 to 5% by weight finely divided inorganic binder, said noble metal powder comprising from 83 to 88% by weight gold particles, and from 17 to 12% by weight palladium particles, said inorganic binder consisting essentially of glass having a density of at least 7.2 gm./cc. and said glass consisting essentially of from 55 to 85% by weight $Bi_2O_3$, from 5 to 42% by weight PbO, from 0.5 to 5.0%, by weight $B_2O_3$, and from 0.5 to 5.0% by weight $SiO_2$.

7. The metalizing composition of claim 6 further characterized in that it is comprised of from 78 to 88% by weight finely divided noble metal powder and from 22 to 12% by weight inorganic binder.

8. The metalizing composition of claim 6 further characterized in that said finely divided noble metal powder comprises about 85% by weight gold particles, and about 15% by weight palladium particles and said glass consists essentially of about 82% by weight $Bi_2O_3$, about 11% by weight PbO, about 3.5% by weight $B_2O_3$, and about 3.5% by weight $SiO_2$.

9. The metalizing composition of claim 6 further characterized in that said glass consists essentially of 70 to 85% by weight $Bi_2O_3$, 5 to 25% by weight PbO and 6 to 10% by weight combined amount of $SiO_2$ and $B_2O_3$.

10. An ink comprising from 2 to 20 parts of the metalizing composition of claim 6 and 1 part of an inert organic vehicle.

11. A metalizing composition comprising from 70 to 95% by weight finely divided noble metal powder, and from 30 to 5% by weight finely divided inorganic binder, said noble metal powder being selected from the group consisting of a gold powder comprising 85 to 90% by weight gold particles and 15 to 10% by weight gold particles, a palladium powder comprising 83 to 88% by weight gold particles and 17 to 12% by weight palladium particles, and a mixture of said platinum powder and palladium powder, said inorganic binder consisting essentially of glass having a density of at least 7.2 gm./cc. and said glass consisting essentially of from 55 to 85% by weight $Bi_2O_3$, from 5 to 42% by weight PbO, from 0.5 to 5.0% by weight $B_2O_3$ and from 0.5 to 5.0% by weight $SiO_2$.

12. An ink comprising from 2 to 20 parts of the metalizing composition of claim 11 and 1 part of an inert organic vehicle.

References Cited

UNITED STATES PATENTS

| | | | |
|---|---|---|---|
| 2,385,580 | 9/1945 | Knox | 117—124 |
| 2,789,187 | 4/1957 | Romer | 252—5.4 XR |
| 3,099,575 | 7/1963 | Hill | 117—212 |
| 3,293,501 | 12/1966 | Martin | 252—514 XR |
| 3,347,799 | 10/1967 | Wagner | 252—514 |

FOREIGN PATENTS

| | | |
|---|---|---|
| 546,067 | 9/1957 | Canada. |

JULIUS FROME, *Primary Examiner.*

L. HAYES, *Assistant Examiner.*

U.S. Cl. X.R.

106—193; 117—123, 227, 160; 252—514

U.S. DEPARTMENT OF COMMERCE

PATENT OFFICE

Washington, D.C. 20231

UNITED STATES PATENT OFFICE

CERTIFICATE OF CORRECTION

Patent No. 3,440,062 April 22, 1969

Lewis C. Hoffman

It is certified that error appears in the above identified patent and that said Letters Patent are hereby corrected as shown below:

Column 5, line 39, after "finely" insert -- divided --. Column 6, line 28, after "10% by weight", change "gold" to -- platinum --.

Signed and sealed this 24th day of February 1970.

(SEAL)
Attest:

Edward M. Fletcher, Jr.
Attesting Officer

WILLIAM E. SCHUYLER, JR
Commissioner of Patents